(12) United States Patent
Ochi et al.

(10) Patent No.: US 11,502,146 B2
(45) Date of Patent: Nov. 15, 2022

(54) DISPLAY DEVICE WITH FRAME REGION INCLUDING METAL LAYERS ACROSS SLIT

(71) Applicant: SHARP KABUSHIKI KAISHA, Sakai (JP)

(72) Inventors: Hisao Ochi, Sakai (JP); Jumpei Takahashi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 170 days.

(21) Appl. No.: 17/040,927

(22) PCT Filed: Mar. 28, 2018

(86) PCT No.: PCT/JP2018/012952
§ 371 (c)(1),
(2) Date: Sep. 23, 2020

(87) PCT Pub. No.: WO2019/186823
PCT Pub. Date: Oct. 3, 2019

(65) Prior Publication Data
US 2021/0020715 A1    Jan. 21, 2021

(51) Int. Cl.
*H01L 27/32* (2006.01)
*H01L 51/52* (2006.01)

(52) U.S. Cl.
CPC ...... *H01L 27/3246* (2013.01); *H01L 27/3276* (2013.01); *H01L 51/5253* (2013.01)

(58) Field of Classification Search
CPC ............ H01L 27/3246; H01L 27/3276; H01L 51/5253
See application file for complete search history.

(56) References Cited

U.S. PATENT DOCUMENTS

| | | |
|---|---|---|
| RE42,215 E | 3/2011 | Kobayashi et al. |
| RE43,738 E | 10/2012 | Kobayashi et al. |
| RE44,902 E | 5/2014 | Kobayashi et al. |
| RE45,556 E | 6/2015 | Kobayashi et al. |
| RE47,817 E | 1/2020 | Kobayashi et al. |
| 2003/0168966 A1 | 9/2003 | Kobayashi et al. |
| 2005/0112408 A1 | 5/2005 | Kobayashi et al. |
| 2017/0125505 A1* | 5/2017 | Oh ...................... H01L 27/3276 |
| 2017/0262109 A1* | 9/2017 | Choi ................... H01L 51/0097 |
| 2017/0352717 A1* | 12/2017 | Choi ................... H01L 51/0097 |
| 2018/0315809 A1* | 11/2018 | Kim .................... H01L 51/5253 |

FOREIGN PATENT DOCUMENTS

JP    2011-175300 A    9/2011

* cited by examiner

*Primary Examiner* — Lex H Malsawma
(74) *Attorney, Agent, or Firm* — ScienBiziP, P.C.

(57) ABSTRACT

A first metal layer provided on a resin substrate layer, a flattening film provided on the first metal layer, a second metal layer and a plurality of organic EL elements provided on the flattening film, and a sealing film covering the plurality of organic EL elements are provided. An organic layer provided in the sealing film includes a circumferential end edge positioned in a frame region. A slit overlapping the circumferential end edge of the organic layer is formed in an outer side of the flattening film. The first metal layer and the second metal layer are in contact with each other inside the slit. An opening is formed in a metal layer of the first metal layer and the second metal layer, the opening exposing an interlayer insulating film from the metal layer of the first metal layer and the second metal layer at a position at which the organic layer and the slit overlap each other.

16 Claims, 12 Drawing Sheets

DISPLAY DEVICE WITH FRAME REGION INCLUDING METAL LAYERS ACROSS SLIT

TECHNICAL FIELD

The present disclosure relates to a display device.

BACKGROUND ART

In recent years, an organic electroluminescence (EL) display device of the self-luminous type using an organic EL element has attracted attention as a display device that can replace a liquid crystal display device. The organic EL display device is provided with a sealing film that covers the organic EL element to suppress degradation of the organic EL element due to penetration of, for example, moisture and oxygen. As a sealing structure obtained by the sealing film, there has been proposed a structure in which a layered film including an organic layer and an inorganic layer constitutes the sealing film (for example, see JP 2011-175300 A PTL 1). The organic layer constituting the sealing film is formed by an ink-jet method, for example.

SUMMARY

Incidentally, the film formation properties of an organic layer formed by an ink-jet method are easily affected by a state of a film formed surface, and thus it is difficult to form a peripheral edge (edge) of the organic layer at high accuracy. When the organic layer is formed, a material (ink) of the organic layer is not applied to a predetermined position in a frame region, and stagnates on a display region side such as a part in which a monolithic circuit is present. In this case, when a foreign matter is present at a location that is originally intended to be covered with the organic layer, a sealing film fails to cover the foreign matter, and a defect may be caused in the sealing film.

For this reason, it is necessary to confirm that the material forming the organic layer is applied to the predetermined position in the frame region at a step of forming the sealing film. However, in the part of the frame region including the peripheral edge position of the organic layer, a metal layer constituting an electrode of the organic EL element and a frame wiring line is formed, and a metal material such as silver (Ag) having high reflectivity is suitably used for the metal layer. Thus, due to light reflected by the metal layer, it is difficult to confirm a coating position of the material forming the organic layer.

A technique of the present disclosure has been made in view of this point, and an object of the present disclosure is to securely confirm that a material forming an organic layer is applied to a predetermined position in a frame region.

Solution to Problem

A display device according to the technique of the present disclosure includes a substrate, a first metal layer being provided on the substrate, a flattening film being provided on the first metal layer, a second metal layer and a plurality of light-emitting elements being provided on the flattening film, and a sealing film covering the plurality of light-emitting elements, wherein a display region and a frame region are provided, the display region in which an image is displayed by light emission of the plurality of light-emitting elements, and the frame region being positioned in a periphery of the display region, the sealing film includes an organic layer, and the organic layer includes a circumferential end edge being positioned in the frame region, a slit is formed in an outer side of the flattening film, the slit overlapping the circumferential end edge of the organic layer, the first metal layer and the second metal layer are each provided across the slit, and are in contact with each other inside the slit, and an opening is formed in at least one metal layer of the first metal layer and the second metal layer, the opening exposing a lower layer of the first metal layer from the at least one metal layer at a position at which the organic layer and the slit overlap each other.

According to the display device described above, the opening is formed in at least one metal layer of the first metal layer and the second metal layer being in contact with each other inside the slit of the flattening film in the frame region, and the opening exposes the lower layer of the first metal layer at the position at which the organic layer and the slit overlap each other. Thus, at the location at which the opening is formed, light is not reflected by the metal layer, and even when a metal material having high reflectivity is used for the metal layer, it is possible to securely confirm that the material for forming the organic layer is applied to the predetermined position in the frame region in manufacturing of the display device. Accordingly, inspection for a coating region of the organic layer can be performed easily, and the number of defective panels fed to the next step can be reduced.

DESCRIPTION OF EMBODIMENTS

With reference to the drawings, exemplary embodiments will be described below in detail.

In the present embodiment, an organic EL display device is described as an example with regard to a display device according to the technique of the present disclosure.

Figure 1:
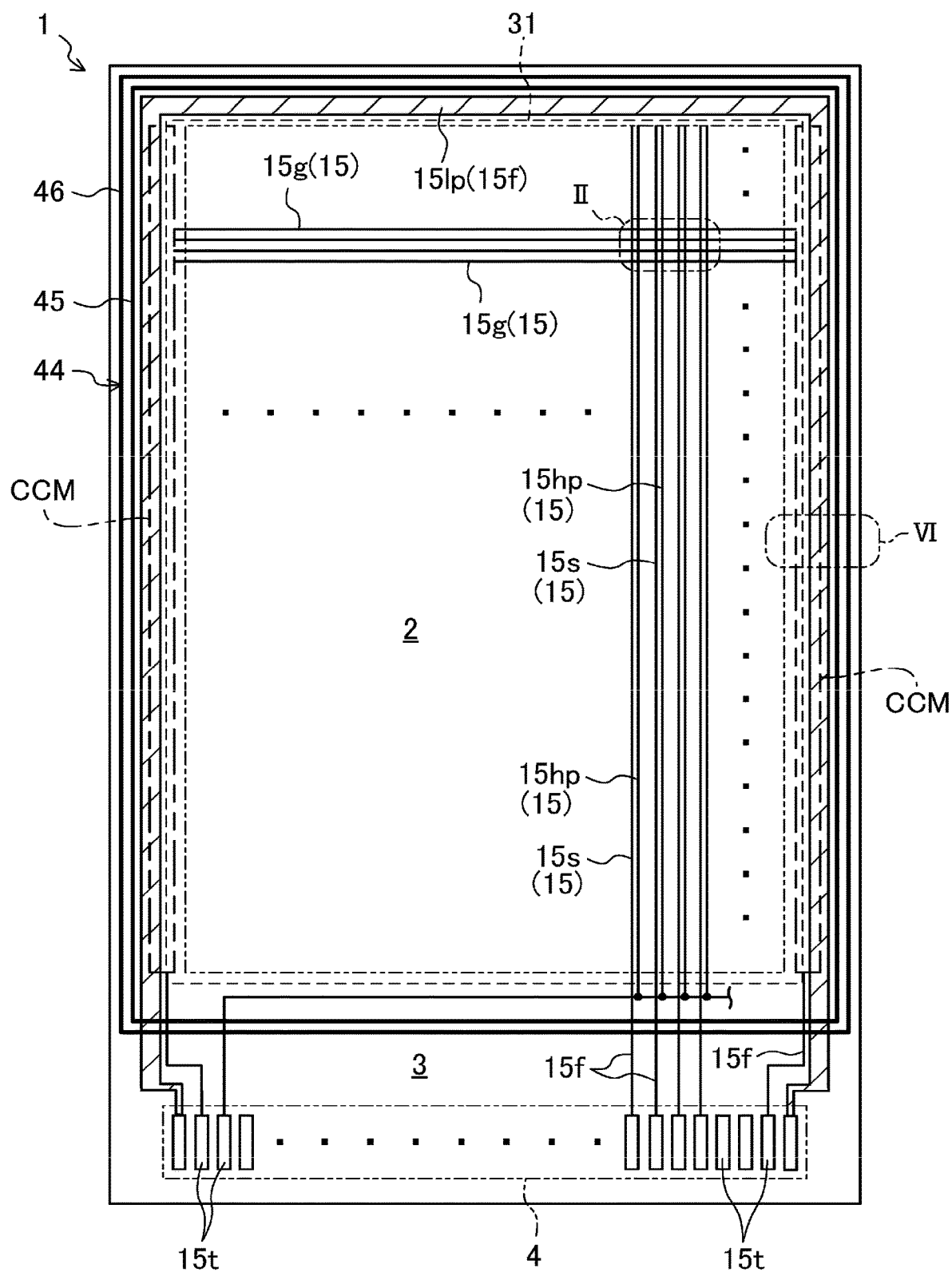
FIG. 1 is a plan view illustrating a schematic configuration of an organic EL display device according to an embodiment.
Figure 2:
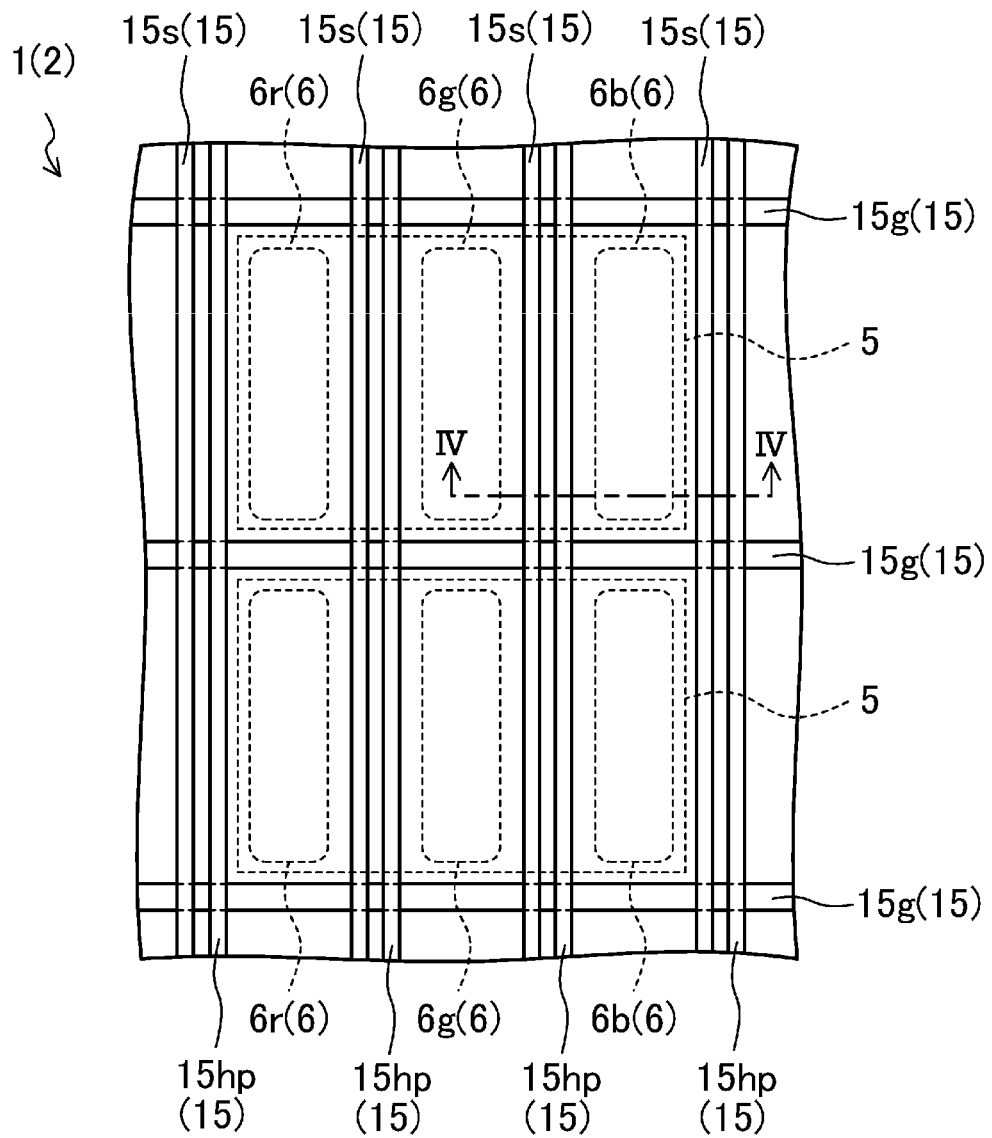
FIG. 2 is a plan view illustrating a part of a display region surrounded by II of the organic EL display device of FIG. 1.
Figure 3:
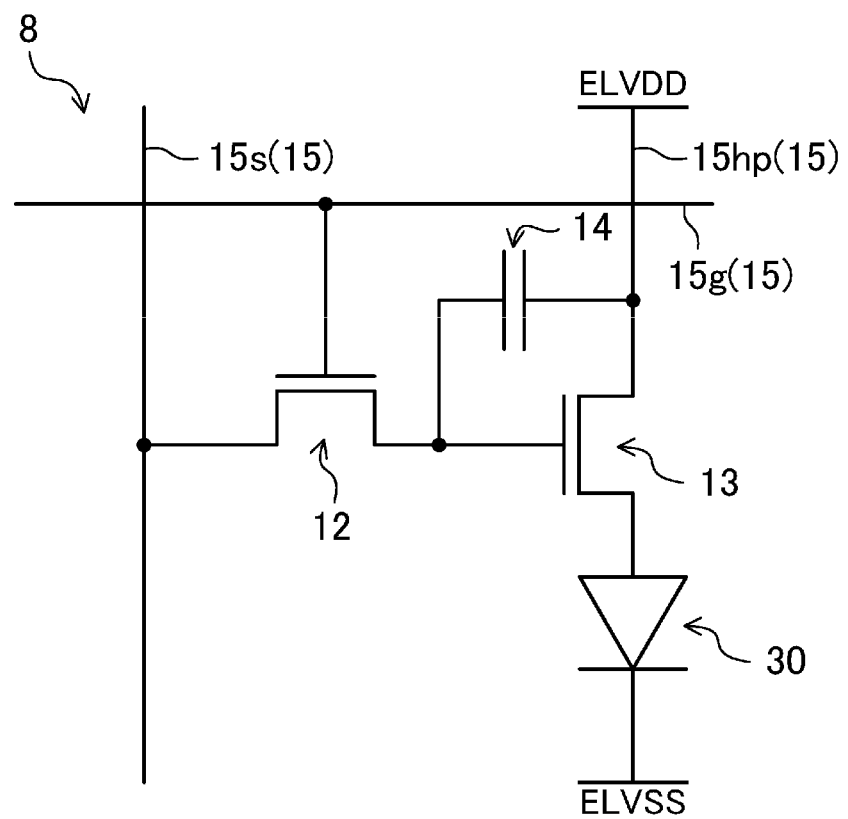
FIG. 3 is an equivalent circuit diagram of a part of a TFT layer constituting the organic EL display device according to the embodiment.
Figure 4:
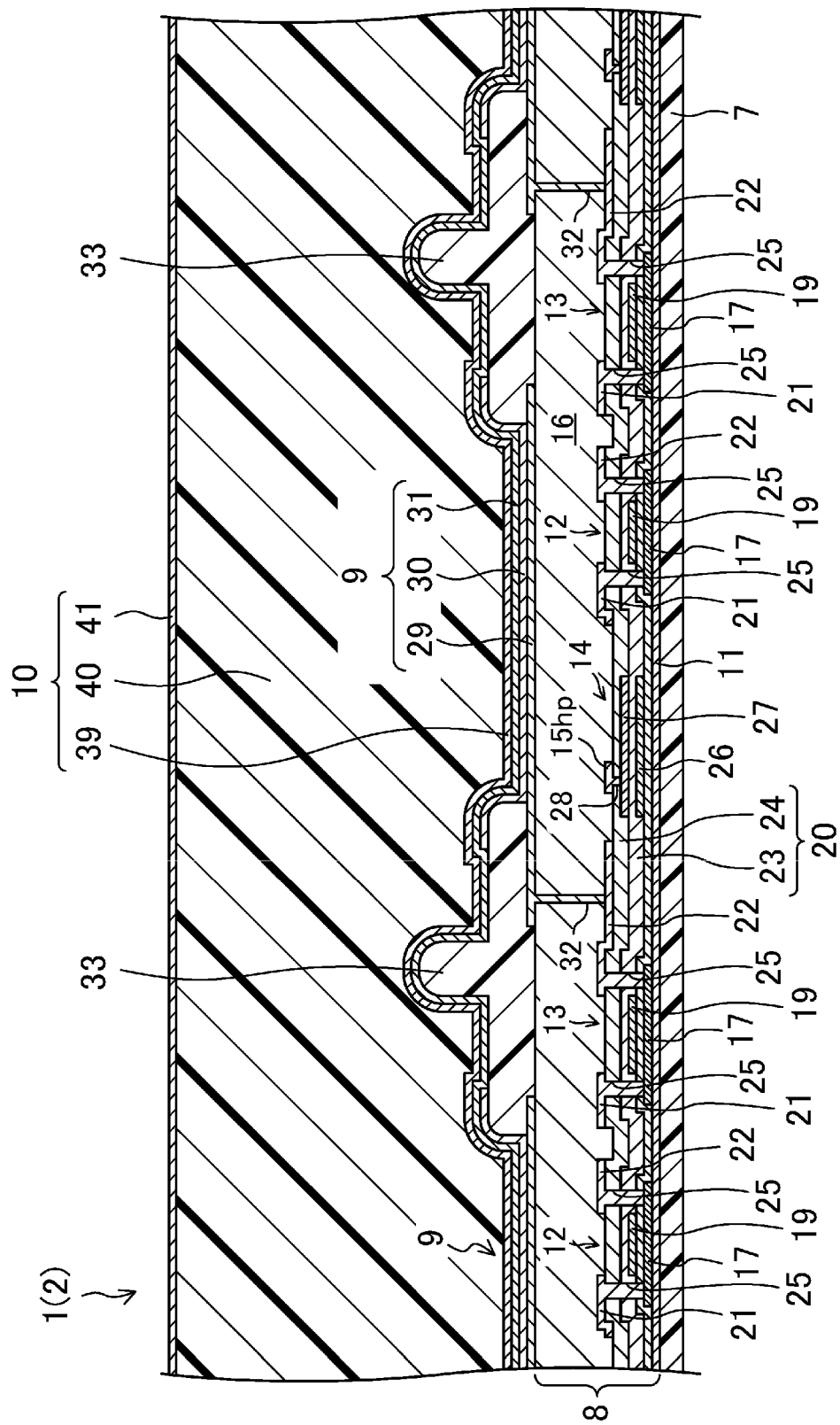
FIG. 4 is a cross-sectional view at a location taken along line IV-IV of the display region of FIG. 2.
Figure 5:
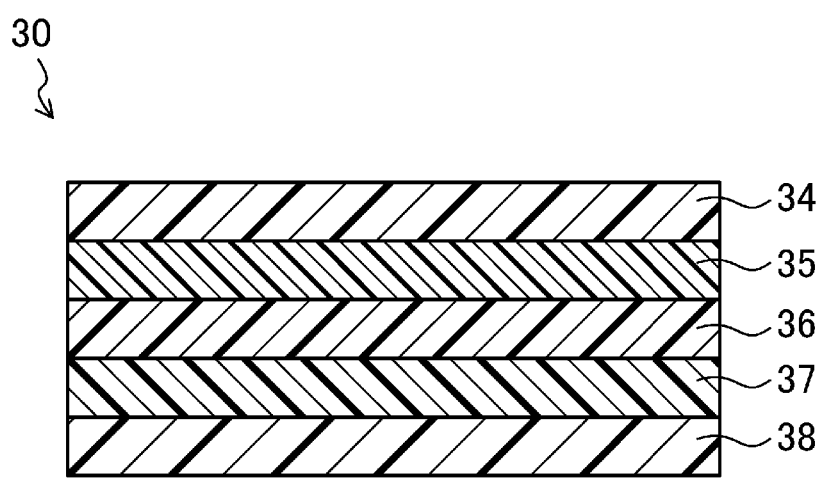
FIG. 5 is a cross-sectional view illustrating a structure of an organic EL layer constituting the organic EL display device.

FIG. 1 is a plan view illustrating a schematic configuration of an organic EL display device 1. FIG. 2 is a plan view illustrating a part of a display region 2 surrounded by II of the organic EL display device 1 of FIG. 1. FIG. 3 is an equivalent circuit diagram of a part of a TFT layer 8 constituting the organic EL display device 1. FIG. 4 is a cross-sectional view at a location taken along line IV-IV of the display region 2 of FIG. 2. FIG. 5 is a cross-sectional view illustrating a structure of an organic EL layer 30 constituting the organic EL display device 1.

As illustrated in FIG. 1, the organic EL display device 1 includes the display region 2 having a rectangular shape in which an image is displayed and a frame region 3 having a rectangular shape and provided in a periphery of the display region 2. Then, a terminal portion 4 to be coupled to an external circuit is provided in a part constituting one side of the frame region 3. Although not illustrated, one end portion of a wiring board such as a flexible printed circuit (FPC) is coupled to the terminal portion 4.

Further, a part of the frame region 3 constitutes each of the sides adjacent to the side provided with the terminal portion 4 (each of the right side and the left side of FIG. 1). The part includes a control circuit region CCM in which a control circuit such as a gate driver circuit (not illustrated) is formed monolithically on a substrate (a resin substrate layer 7 described below). Additionally, between the display region 2 and the terminal portion 4 in the frame region 3, a plurality of frame wiring lines 15f are provided. Each of the frame wiring lines 15f constitutes a wiring line terminal 15t coupled to a wiring board in the terminal portion 4. In the terminal portion 4, a plurality of the wiring line terminals 15t are aligned in a predetermined pattern.

The plurality of frame wiring lines 15f include a low voltage power source wiring line 15lp (indicated with a hatched area) that is electrically coupled to a second electrode 31 of an organic EL element 9 described below. The low voltage power source wiring line 15lp is provided to surround the display region 2 in the parts constituting the three sides of the frame region 3 except for the side provided with the terminal portion 4, and is drawn out to the terminal portion 4. The low voltage power source wiring line 15lp is electrically coupled to a low voltage power source (ELVSS), which is not illustrated, via the wiring line terminals 15t provided in the terminal portion 4.

The organic EL display device 1 employs an active matrix driving method. In the display region 2, a plurality of pixels 5 illustrated in FIG. 2 are disposed in a matrix shape. For example, each of the pixels 5 includes three color subpixels 6 being a subpixel 6r for displaying a red color, a subpixel 6g for displaying a green color, and a subpixel 6b for displaying a blue color. Those subpixels 6r, 6g, and 6b of the three colors are aligned with a juxtaposition, and are adjacent to one another in a stripe shape.

As illustrated in FIG. 4, the organic EL display device 1 includes the resin substrate layer 7 being a substrate, a thin film transistor (TFT) layer 8 provided on the resin substrate layer 7, a plurality of the organic EL elements 9 being light-emitting elements provided on the TFT layer 8, and a sealing film 10 that covers the plurality of organic EL elements 9.

The resin substrate layer 7 is formed of, for example, a polyimide resin, and has flexibility.

The TFT layer 8 includes a base coat film 11 provided on the resin substrate layer 7, a plurality of first TFTs 12, a plurality of second TFTs 13, a plurality of capacitors 14, and the various display wiring lines 15 that are provided on the base coat film 11, and a flattening film 16 provided to cover the plurality of first TFTs 12, the plurality of second TFTs 13, the plurality of capacitors 14, and the display wiring lines 15.

The base coat film 11 includes a single-layer film or a layered film of an inorganic insulating layer of, for example, silicon nitride, silicon oxide, silicon oxide nitride, or the like. Each of the first TFTs 12, each of the second TFTs 13, and each of the capacitors 14 are provided for each of the subpixels 6.

As illustrated in FIG. 2 and FIG. 3, as the display wiring lines 15, a plurality of gate wiring lines 15g extending in parallel with each other, a plurality of source wiring lines 15s extending in parallel with each other in a direction intersecting the gate wiring lines 15g, and a plurality of high voltage power source wiring lines 15hp extending along the source wiring lines 15s are provided. Additionally, the gate wiring lines 15g, the source wiring lines 15s, and the high voltage power source wiring lines 15hp are insulated from one another, and are formed in a lattice pattern as a whole to define each of the subpixels 6.

Each of the source wiring lines 15s and each of the high voltage wiring lines 15hp are drawn out from the display region 2 to the terminal portion 4 as the frame wiring lines 15f. Each of the high voltage power source wiring lines 15hp is electrically coupled to a high voltage power source (ELVDD), which is not illustrated, via the wiring line terminals 15t provided in the terminal portion 4. Each of the gate power source wiring lines 15g is coupled to the gate driver circuit in the control circuit region CCM, and is sequentially driven by the gate driver circuit.

The first TFT 12 and the second TFT 13 are examples of an active element, and employ a top gate type structure, for example. Specifically, the first TFT 12 and the second TFT 13 each include a semiconductor layer 17 provided in an island shape on the base coat film 11, a gate insulating film 18 that covers the semiconductor layer 17, a gate electrode 19 that overlaps a part (channel region) of the semiconductor layer 17 via the gate insulating film 18, an interlayer insulating film 20 that covers the gate electrode 19, and a source electrode 21 and a drain electrode 22 that are provided on the interlayer insulating film 20.

The gate electrode 19 is formed of a material identical to a material of the plurality of gate wiring lines 15g in a layer identical to a layer of the plurality of gate wiring lines 15g. The interlayer insulating film 20 includes a layered film including a first interlayer insulating film 23 and a second interlayer insulating film 24. The first interlayer insulating film 23, the second interlayer insulating film 24, and the gate insulating film 18 each include a single-layer film or a layered film of an inorganic insulating layer of, for example, silicon nitride, silicon oxide, silicon oxide nitride, or the like.

The source electrode 21 and the drain electrode 22 are separated from each other, and are respectively coupled to different parts (the source region and the drain region) of the semiconductor layer 17 via contact holes 25 formed in the gate insulating film 18 and the interlayer insulating film 20. In the display region 2, the source electrode 21 and the drain electrode 22 are formed of a material identical to a material of the plurality of source wiring lines 15s in a layer identical to a layer of the plurality of source wiring lines 15s.

In the first TFT 12, the gate electrode 19 is provided in an integrated manner with the corresponding gate wiring line 15g, the source electrode 21 is provided in an integrated manner with the corresponding source wiring line 15s, and the drain electrode 22 is electrically coupled to the gate electrode 19 and the capacitor 14 of the second TFT 13. In the second TFT 13, the source electrode 21 is electrically coupled to the high voltage power source wiring line 15hp.

The capacitor 14 is coupled to the corresponding first TFT 12 and the corresponding high voltage power source wiring line 15hp. The capacitor 14 includes a lower conductive layer 26 provided on the gate insulating film 18, the first interlayer insulating film 23 that covers the lower conductive layer 26, and an upper conductive layer 27 that overlaps the lower conductive layer 26 via the first interlayer insulating film 23. The lower conductive layer 26 is formed of a material identical to a material of the gate electrode 19 in a layer identical to a layer of the gate electrode 19. The upper conductive layer 27 is coupled to the high voltage power source wiring line 15hp via a contact hole 28 formed in the second interlayer insulating film 24.

In the display region 2, the flattening film 16 covers parts except for a part of the drain electrode 22 of the second TFT 13. Accordingly, a surface of the TFT layer 8 is flattened not to reflect the source wiring line 15s, the high voltage power source wiring line 15hp, and surface shapes of the first TFT 12 and the second TFT 13. The flattening film 16 is formed of a colorless transparent organic resin material such as an acrylic resin.

The organic EL element 9 is provided in each of the subpixels 6 on the flattening film 16. The display region 2 includes the organic EL element 9. The organic EL element 9 employs a top-emitting type structure. Specifically, the organic EL element 9 includes a first electrode 29 provided in a surface of the flattening film 16, the organic EL layer 30 being a function layer provided on the first electrode 29, and the second electrode 31 overlapping the first electrode 29 via the organic EL layer 30.

A plurality of the first electrodes 29 are disposed in a matrix shape. Each of the first electrodes 29 is provided for each of the organic EL elements 9, and is coupled to the drain electrode 22 of the second TFT 13 in the corresponding subpixel 6 via a contact hole 32 formed in the flattening film 16. The first electrode 29 has a function to inject a positive hole (hole) into the organic EL layer 30, and is preferably formed of a material having a large work function to improve hole injection efficiency into the organic EL layer 30.

Examples of a material of the first electrode 29 include a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

Additionally, for example, the material of the first electrode 29 may be an alloy such as magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al).

Additionally, for example, the material of the first electrode 29 may be a conductive oxide such as tin oxide (SnO), zinc oxide (ZnO), indium tin oxide (ITO), and indium zinc oxide (IZO). Additionally, the first electrode 29 may be formed by layering a plurality of layers including the materials described above. Note that examples of the material having a large work function include indium tin oxide (ITO) and indium zinc oxide (IZO).

The first electrodes 29 of the adjacent subpixels 6 are defined by an edge cover 33. The edge cover 33 is formed in a lattice pattern, and covers a peripheral portion of each of the first electrodes 29. Examples of a material of the edge cover 33 include an inorganic compound such as silicon oxide, silicon nitride, and silicon oxynitride, and an organic resin material such as a polyimide resin, an acrylic resin, a polysiloxane resin, and a novolac resin.

The organic EL layer 30 is provided for each of the organic EL elements 9. The organic EL layer 30 includes a structure in which a hole injection layer 34, a hole transport layer 35, a light-emitting layer 36, an electron transport layer 37, and an electron injection layer 38 illustrated in FIG. 5 are layered in this order on the first electrode 29.

The hole injection layer 34 is also referred to as an anode electrode buffer layer, and has a function to improve efficiency of hole injection from the first electrode 29 into the organic EL layer 30 by bringing energy levels of the first electrode 29 and the organic EL layer 30 closer to each other. Examples of a material of the hole injection layer 34 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 35 has a function to improve efficiency of hole transport from the first electrode 29 to the organic EL layer 30. Examples of a material of the hole transport layer 35 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 36 has a function to recombine a hole injected from the first electrode 29 and an electron injected from the second electrode 31 and emit light when a voltage is applied by the first electrode 29 and the second electrode 31. The light-emitting layer 36 is formed of a material that varies in accordance with a luminescent color (for example, red, green, or blue) of the organic EL element 9 in the individual subpixel 6.

Examples of a material of the light-emitting layer 36 include a metal oxinoid compound (8-hydroxyquinoline metal complex), a naphthalene derivative, an anthracene derivative, a diphenyl ethylene derivative, a vinyl acetone derivative, a triphenylamine derivative, a butadiene derivative, a coumarin derivative, a benzoxazole derivative, an oxadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, and polysilane.

The electron transport layer 37 has a function to facilitate migration of an electron to the light-emitting layer 36 efficiently. Examples of a material of the electron transport layer 37 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound, as an organic compound.

The electron injection layer 38 is also referred to as a cathode electrode buffer layer, and has a function to improve electron injection efficiency from the second electrode 31 into the organic EL layer 30 by bringing energy levels of the second electrode 31 and the organic EL layer 30 closer to each other. Examples of a material of the electron injection layer 38 include an inorganic alkaline compound such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 4, the second electrode 31 is provided in and shared by the plurality of organic EL elements 9 (that is, shared by the plurality of subpixels 6), and covers the organic EL layer 30. The second electrode 31 is coupled to the low voltage power source wiring line 15*lp*, and conduction with a low voltage power source (ELVSS) is established at the wiring line terminal 15*t* provided in the terminal portion 4 through the low voltage power source wiring line 15*lp*. The second electrode 31 has a function to inject an electron into the organic EL layer 30, and is preferably formed of a material having a small work function to improve electron injection efficiency into the organic EL layer 30.

Examples of a material of the second electrode 31 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

Additionally, examples of a material of the second electrode 31 include an alloy of magnesium (Mg)-copper (Cu), an alloy of magnesium (Mg)-silver (Ag), an alloy of sodium (Na)-potassium (K), an alloy of astatine (At)-astatine oxide ($AtO_2$), an alloy of lithium (Li)-aluminum (Al), an alloy of lithium (Li)-calcium (Ca)-aluminum (Al), and an alloy of lithium fluoride (LiF)-calcium (Ca)-aluminum (Al).

Additionally, for example, the material of the second electrode 31 may be a conductive oxide such as tin oxide (SnO), zinc oxide (ZnO), indium tin oxide (ITO), and indium zinc oxide (IZO). Additionally, the second electrode 31 may be formed by layering a plurality of layers including the materials described above. Note that examples of the material having a small work function include magnesium (Mg), lithium (Li), lithium fluoride (LiF), an alloy of magnesium (Mg)-copper (Cu), an alloy of magnesium (Mg)-silver (Ag), an alloy of sodium (Na)-copper (Cu), an alloy of sodium (Na)-potassium (K), an alloy of lithium (Li)-aluminum (Al), an alloy of lithium (Li)-calcium (Ca)-aluminum (Al), and an alloy of lithium fluoride (LiF)-calcium (Ca)-aluminum (Al).

Figure 7:
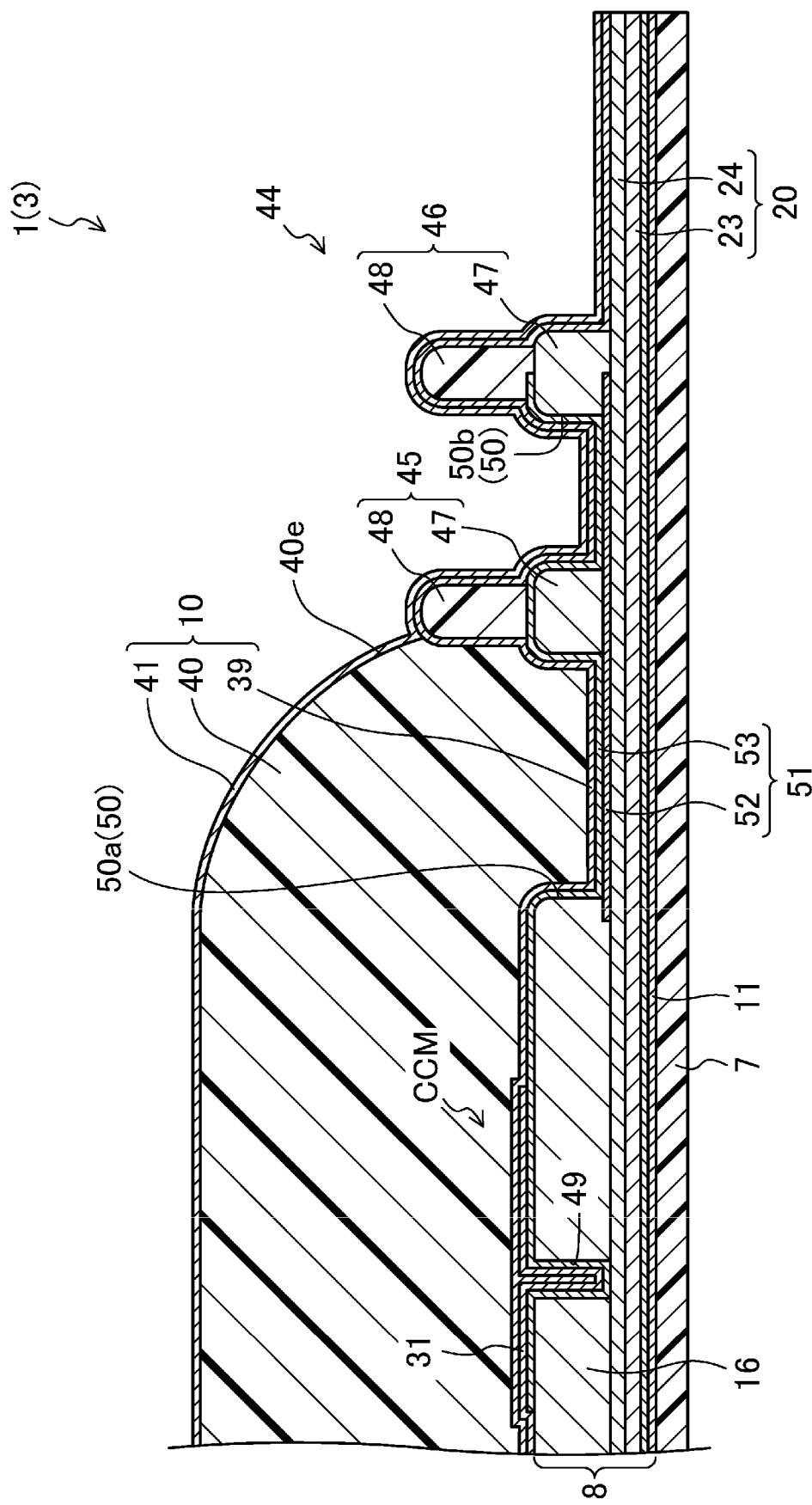
FIG. 7 is a cross-sectional view at a location taken along line VII-VII of the organic EL display device of FIG. 6.
Figure 8:
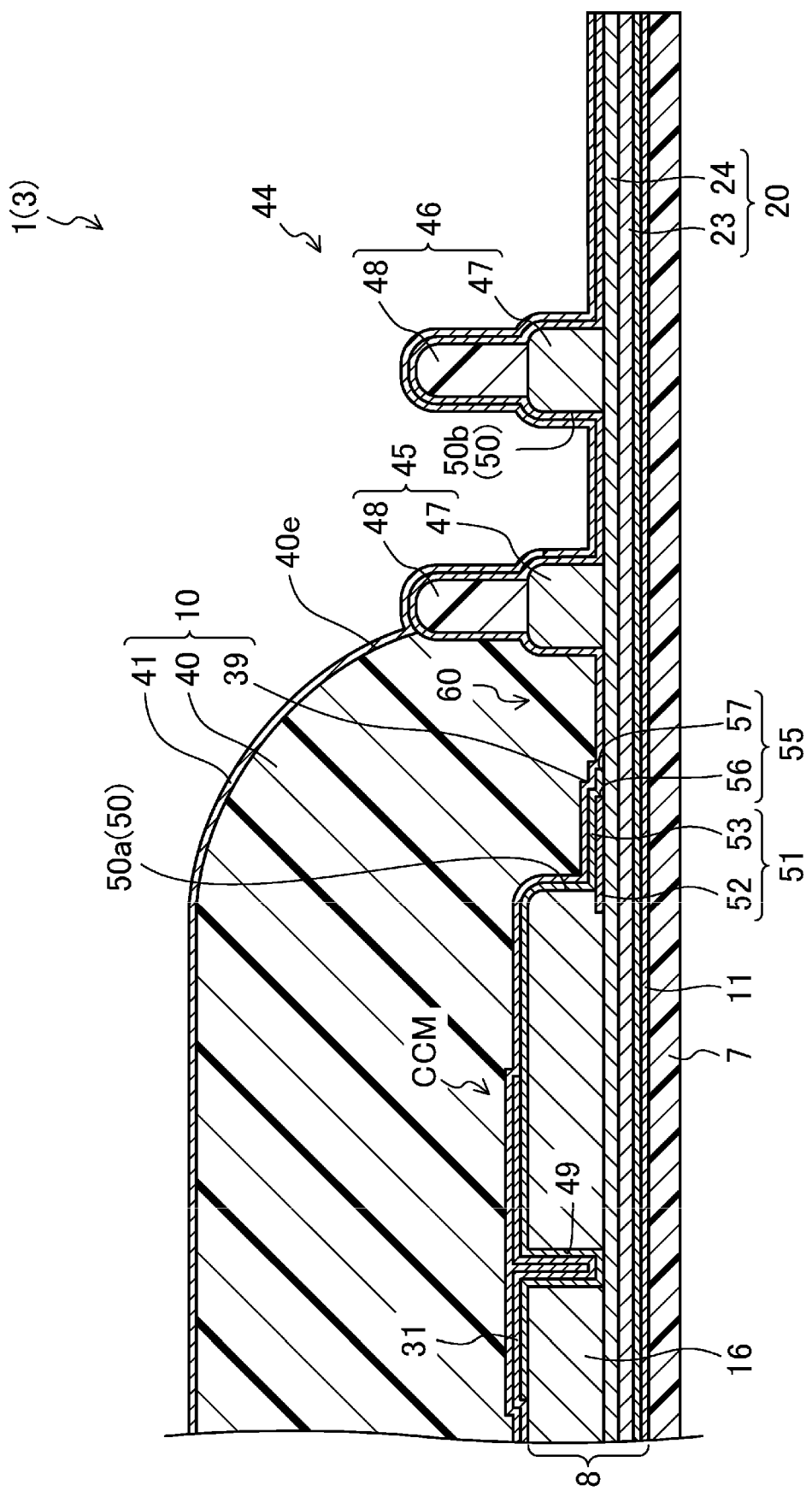
FIG. 8 is a cross-sectional view at a location taken along line VIII-VIII of the organic EL display device of FIG. 6.

The sealing film 10 has a function to protect the organic EL element 9 from moisture, oxygen, and the like. As illustrated in FIG. 4, FIG. 7, and FIG. 8, the sealing film 10 includes a first inorganic layer 39 covering the second electrode 31, an organic layer 40 provided on the first inorganic layer 39, and a second inorganic layer 41 covering the organic layer 40.

The first inorganic layer 39 and the second inorganic layer 41 are formed of, for example, an inorganic material such as silicon oxide ($SiO_2$), aluminum oxide ($Al_2O_3$), and silicon carbonitride ($Si_3N_4$). The organic layer 40 is formed of, for example, an organic resin material such as an acrylate, an epoxy resin, a silicone resin, polyurea, parylene, polyimide, and polyamide.

Figure 6:
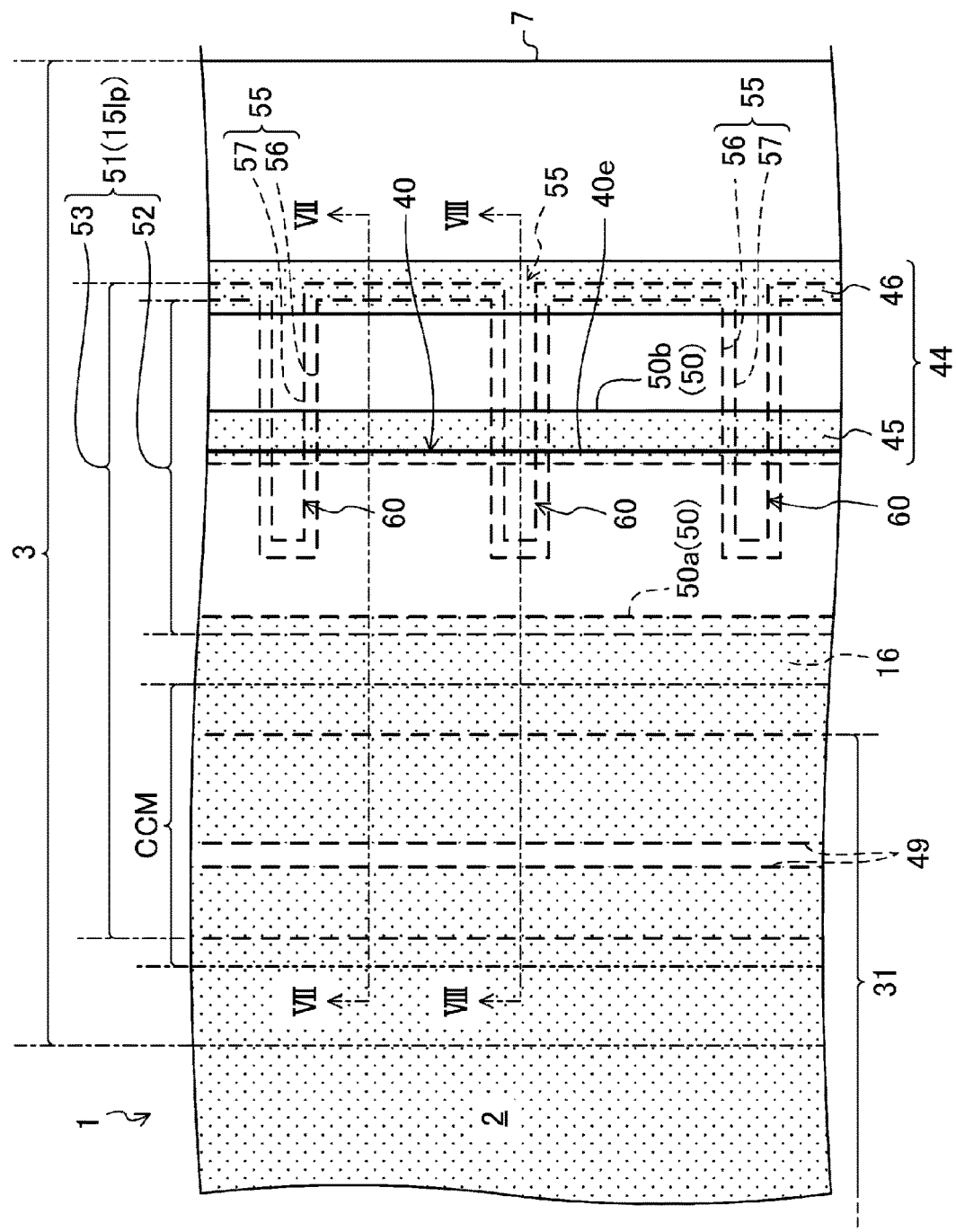
FIG. 6 is a plan view illustrating a part surrounded by VI of the organic EL display device of FIG. 1.

FIG. 6 is a plan view illustrating a part surrounded by VI of the organic EL display device 1 of FIG. 1. FIG. 7 is a cross-sectional view at a location taken along line VII-VII of the organic EL display device 1 of FIG. 6. Additionally, FIG. 8 is a cross-sectional view at a location taken along line VIII-VIII of the organic EL display device 1 of FIG. 6. Note that, in FIG. 6, a region in which the flattening film 16, a first dam wall 45, and a second dam wall 46 are formed is indicated by dots. Additionally, the first inorganic layer 39 and the second inorganic layer 41 constituting the sealing film 10 are omitted in the figure, and a circumferential end edge 40*e* of the organic layer 40 is indicated by a bold line. The same applies to FIG. 9 and FIG. 10 referred in modification examples described below.

The first inorganic layer 39, the organic layer 40, and the second inorganic layer 41 are provided in all the display region 2, and are also provided in the frame region 3 as illustrated in FIG. 6 to FIG. 8. A circumferential end edge of each of the first inorganic layer 39, the organic layer 40, and the second inorganic layer 41 is positioned in the frame region 3. In the frame region 3, the circumferential end edge 40*e* of the organic layer 40 is positioned on the display region 2 side with respect to the circumferential end edges of the first inorganic layer 39 and the second inorganic layer 41.

The frame region 3 is provided with a dam structure 44 for damming back a spread of an organic resin material that is formed into the organic layer 40 in a process of manufacturing the organic EL display device 1. The dam structure 44 includes the first dam wall 45 surrounding the display region 2 and the second dam wall 46 surrounding the first dam wall 45.

The first dam wall 45 and the second dam wall 46 are formed in rectangular shapes identical to each other (see FIG. 1), and are disposed at an interval in the width direction of the frame region 3. The first dam wall 45 and the second dam wall 46 each include a structure in which a first wall layer 47 and a second wall layer 48 are layered. The first wall layer 47 is formed of a material identical to a material of the flattening film 16 in a layer identical to a layer of the flattening film 16. The second wall layer 48 is formed of a material identical to a material of the edge cover 33 in a layer identical to a layer of the edge cover 33.

In the flattening film 16, a trench 49 passing through the flattening film 16 is formed. The trench 49 extends along the three sides of the frame region 3 except for the side provided with the terminal portion 4, and divides the flattening film 16 to have a function to prevent moisture from entering the display region 2. Additionally, in an outer side of the flattening film 16, a slit 50 that exposes a lower layer of the flattening film 16 is formed in one side of the flattening film 16. Specifically, between the flattening film 16 and the first dam wall 45, a first slit 50*a* is formed as the slit 50. Additionally, between the first dam wall 45 and the second dam wall 46, a second slit 50*b* is formed as the slit 50.

The organic layer 40 is provided from the display region 2 to at least the first dam wall 45, and is in contact with the first dam wall 45. Then, the circumferential end edge 40*e* of the organic layer 40 overlaps the first slit 50*a*. In the examples illustrated in FIG. 6 to FIG. 8, the organic layer 40 is provided in an inner side of the first dam wall 45, but is dammed back by the first dam wall 45 and is not provided in an outer side of the first dam wall 45. The organic layer 40 described above covers various elements and circuits such as the organic EL elements 9 and the gate driver circuit. When foreign matters are present at formation locations of the various elements and circuits, the organic layer 40 has a function as a buffer layer that covers and completely envelops the foreign matters and that prevents a defect from being caused in the sealing film 10.

The first inorganic layer 39 and the second inorganic layer 41 cover both the first dam wall 45 and the second dam wall 46. Circumferential end edge portions of the first inorganic layer 39 and the second inorganic layer 41 are joined to each other in the outer side of the first dam wall 45. That is, the organic layer 40 is enveloped by the first inorganic layer 39 and the second inorganic layer 41, and is encapsulated between the first inorganic layer 39 and the second inorganic layer 41.

In the frame region 3, a light reflective portion 51 that reflects incident light from the surface side is provided in a lower layer with respect to the sealing film 10. The light reflective portion 51 includes a first metal layer 52 provided in a lower layer of the flattening film 16 and a second metal layer 53 provided in an upper layer of the flattening film 16. The first metal layer 52 and the second metal layer 53 constitute the low voltage power source wiring line 15lp to surround the display region 2.

The first metal layer 52 is formed of a material identical to a material of the source wiring line 15s, the source electrode 21 and the drain electrode 22 in the display region 2 in a layer identical to a layer of the source wiring line 15s, the source electrode 21, and the drain electrode 22, and is provided on the interlayer insulating film 20. In the frame region 3, the first metal layer 52 is provided from a region overlapping the flattening film 16 to the second dam wall 46, and is exposed inside the first slit 50a and inside the second slit 50b from the flattening film 16, the first dam wall 45, and the second dam wall 46.

The second metal layer 53 is formed of a material identical to a material of the first electrode 29 of the organic EL element 9 in a layer identical to a layer of the first electrode 29, and is provided on the flattening film 16. The second metal layer 53 is provided on the flattening film 16 to the second dam wall 46, and is positioned between the first wall layer 47 and the second wall layer 48 that constitute each of the first dam wall 45 and the second dam wall 46. Then, the second metal layer 53 overlap the first metal layer 52 to be in contact with the first metal layer 52 inside the first slit 50a and inside the second slit 50b, and is electrically coupled to the first metal layer 52.

Additionally, on the flattening film 16, the second metal layer 53 is provided from the outer side of the flattening film 16 with respect to the trench 49 to the display region 2 side with respect to the trench 49, and covers an inner face of the trench 49. On the flattening film 16, the second electrode 31 is provided from the display region 2 side with respect to the trench 49 to the outer side of the flattening film 16 with respect to the trench 49, and overlaps the second metal layer 53 to be in contact with the second metal layer 53, and covers an inner face of the trench 49 together with the second metal layer 53.

In this manner, the inner face of the trench 49 is covered with the second metal layer 53 and the second electrode 31. Accordingly, moisture from an external environment can be prevented from entering the display region 2 in the organic EL display device 1 through the trench 49. The second metal layer 53 and the second electrode 31 overlap each other to be in contact with each other on the flattening film 16 and inside the trench 49, and are electrically coupled to each other. Then, the second electrode 31 is electrically coupled to the first metal layer 52 via the second metal layer 53.

As described above, the first metal layer 52 and the second metal layer 53 are provided across the first slit 50a and the second slit 50b, and are in contact with each other inside the first slit 50a and inside the second slit 50b. The light reflective portion 51 including the first metal layer 52 and the second metal layer 53 satisfies a positional relationship of overlapping the circumferential end edge portion of the organic layer 40 over the first inorganic layer 39 inside the first slit 50a.

An opening 55 is formed in the light reflective portion 51. Inside the first slit 50a and inside the second slit 50b, the opening 55 exposes the interlayer insulating film 20 being a lower layer of the flattening film 16. In the first metal layer 52, a first opening 56 is formed as the opening 55. In the second metal layer 53, a second opening 57 is formed as the opening 55. The first opening 56 has opening area larger than opening area of the second opening 57, and the first metal layer 52 including a peripheral edge of the first opening 56 is covered with the second metal layer 53. The opening 55 includes the first opening 56 and the second opening 57.

As illustrated in FIG. 6, a plurality of the openings 55 are provided at an interval along the first dam wall 45. Each of the openings 55 extends in the width direction of the frame region 3 from a part of the light reflective portion 51 on the display region 2 side with respect to the first dam wall 45 to a part between the first dam wall 45 and the second dam wall 46, and is formed in a cutout slit opened to an outer side of the frame region 3. Then, a part of each of the openings 55 overlaps the organic layer 40 in the inner side of the first dam wall 45.

A location at which the opening 55 is formed in the organic EL display device 1 is an inspected portion 60 for confirming a coating position of the material forming the organic layer 40. The inspected portion 60 is a region in which the first metal layer 52 and the second metal layer 53 are not present due to the opening 55. In the inspected portion 60 describe above, it is possible to confirm whether light is not reflected by the first metal layer 52 and the second metal layer 53, and the organic layer 40 is formed to a position corresponding to the opening 55, that is, to confirm a position of the circumferential end edge of the organic layer 40.

In the organic EL display device 1 including the above-described configuration, in each of the subpixels 6, a gate signal is input to the first TFT 12 via the gate wiring line 15g to turn on the first TFT 12, a predetermined voltage corresponding to a source signal is written in the gate electrode 19 and the capacitor 14 of the second TFT 13 via the source wiring line 15s, and a current corresponding to a gate voltage of the second TFT 13 is supplied from the high voltage power source wiring line 15hp to the organic EL element 9. Accordingly, the light-emitting layer 36 of the organic EL layer 30 emits light, and an image is displayed. Note that, in the organic EL display device 1, even when the first TFT 12 is turned off, the gate voltage of the second TFT 13 is held by the capacitor 14, and thus, light emission performed by the organic EL layer 30 (the light-emitting layer 36) is maintained for each of the subpixels 6 until a gate signal of the next frame is input.

The organic EL display device 1 described above can be manufactured by, for example, forming the TFT layer 8, the organic EL element 9, and the sealing film 10 with use of a known method on the resin substrate layer 7 formed in a surface of a glass substrate, and then peeling the glass substrate from the resin substrate layer 7.

In manufacturing of the organic EL display device 1 described above, at a step of forming the source wiring line 15s, the source electrode 21, and the drain electrode 22 in the display region in a process of forming the TFT layer 8, the first metal layer 52 provided with the first opening 56 is also formed of a film identical to the metal film forming the source wiring line 15s, the source electrode 21, and the drain electrode 22. Additionally, at a step of forming the first electrode 29 in a process of forming the organic EL element 9, the second metal layer 53 provided with the second opening 57 is also formed of a film identical to the metal film forming the first electrode 29. In this manner, the light reflective portion 51 in the frame region 3 is provided with the inspected portion 60 described above.

Additionally, at a step of forming the sealing film 10, the organic layer 40 is formed by an ink-jet method. In this case, to confirm that the material forming the organic layer 40 is applied to a predetermined position in the frame region 3, that is, to at least the first dam wall 45, the inspected portion 60 is subjected to inspection for confirming a coating position of the material forming the organic layer 40.

In the organic EL display device 1 according to the embodiment, in the frame region 3, the openings 55 (the first opening 56 and the second opening 57) exposing the interlayer insulating film 20 at the positions at which the first slit 50a and the organic layer 40 overlap each other are formed in the first metal layer 52 and the second metal layer 53 that are in contact with each other inside the first slit 50a and inside the second slit 50b. Thus, in the inspected portion 60 in which the openings 55 are formed, light is not reflected by the first metal layer 52 and the second metal layer 53. Even when a metal material having high reflectivity is used for the first metal layer 52 and the second metal layer 53, it is possible to securely confirm that the material for forming the organic layer 40 is applied to a predetermined position in the frame region 3 in manufacturing of the organic EL display device 1. Accordingly, inspection for a coating region of the organic layer 40 can be performed easily, and the number of defective panels fed to the next step can be reduced.

First Modification Example of Embodiment

Figure 9:
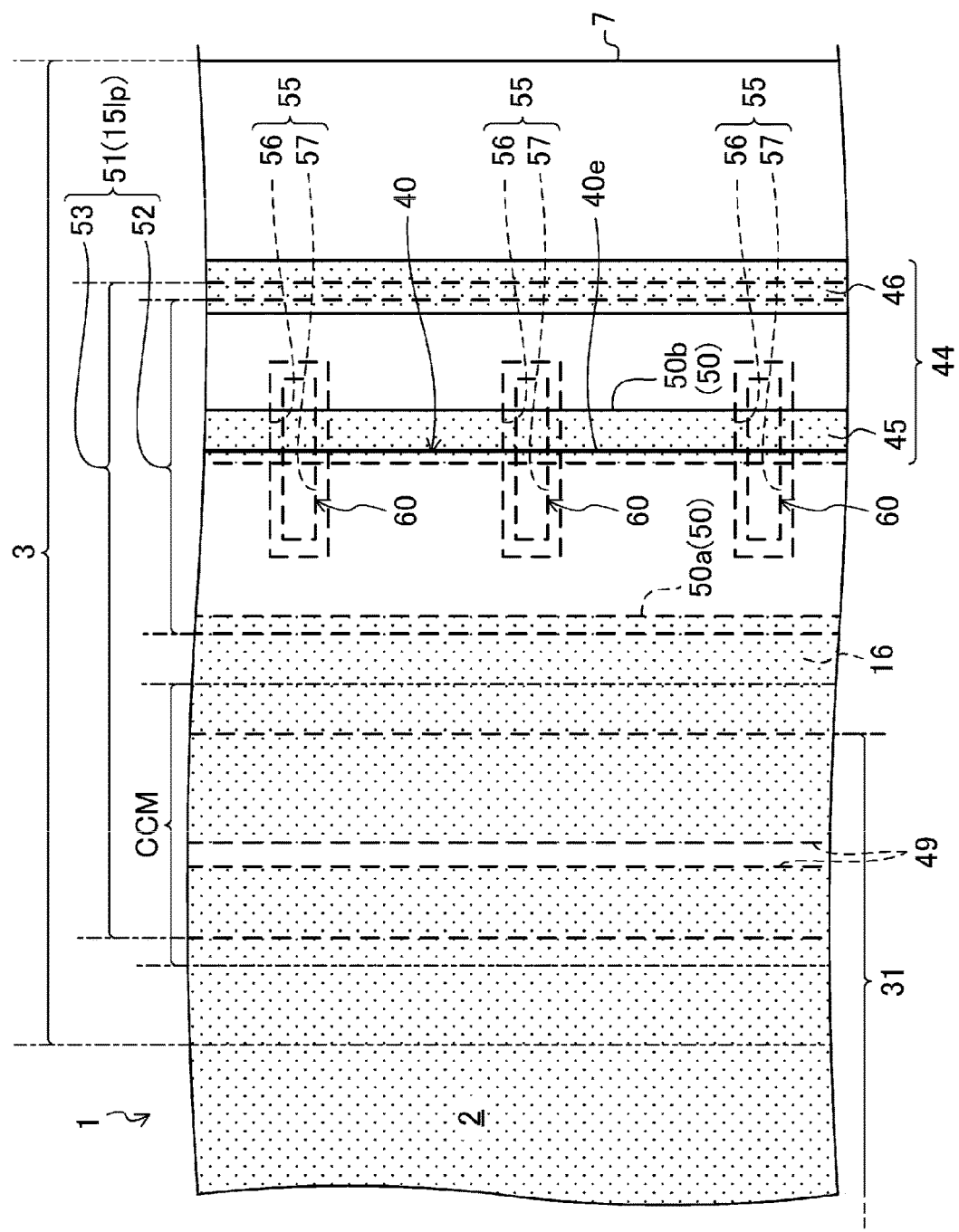
FIG. 9 is a view equivalent to FIG. 6 of an organic EL display device according to a first modification example of the embodiment.

FIG. 9 is a view equivalent to FIG. 6 of an organic EL display device 1 according to a first modification example of the embodiment. In the organic EL display device 1 according to the above-described embodiment, the openings 55 are each formed in a cutout slit opened to the outer side of the frame region 3. However, as illustrated in FIG. 9, in the organic EL display device 1 according to the first modification example, openings 55 (a first opening 56 and a second opening 57) are each formed in a hollow slit including a frame peripheral edge, and, for example, each extend from a center site in the width direction of a first slit 50a to a center site in the width direction of a second slit 50b in a light reflective portion 51.

According to this configuration, effects similar to the effects in the above-described embodiment can be obtained. Moreover, the opening area of the opening 55 in the light reflective portion 51, that is, the opening area of the first opening 56 in a first metal layer 52 and the opening area of the second opening 57 in a second metal layer 53 can be reduced. Thus, a decrease of electrical conductivity of the light reflective portion 51 due to provision of the openings 55, that is, a decrease of electrical conductivity of a low voltage power source wiring line 15lp can be suppressed.

Second Modification Example of Embodiment

Figure 10:
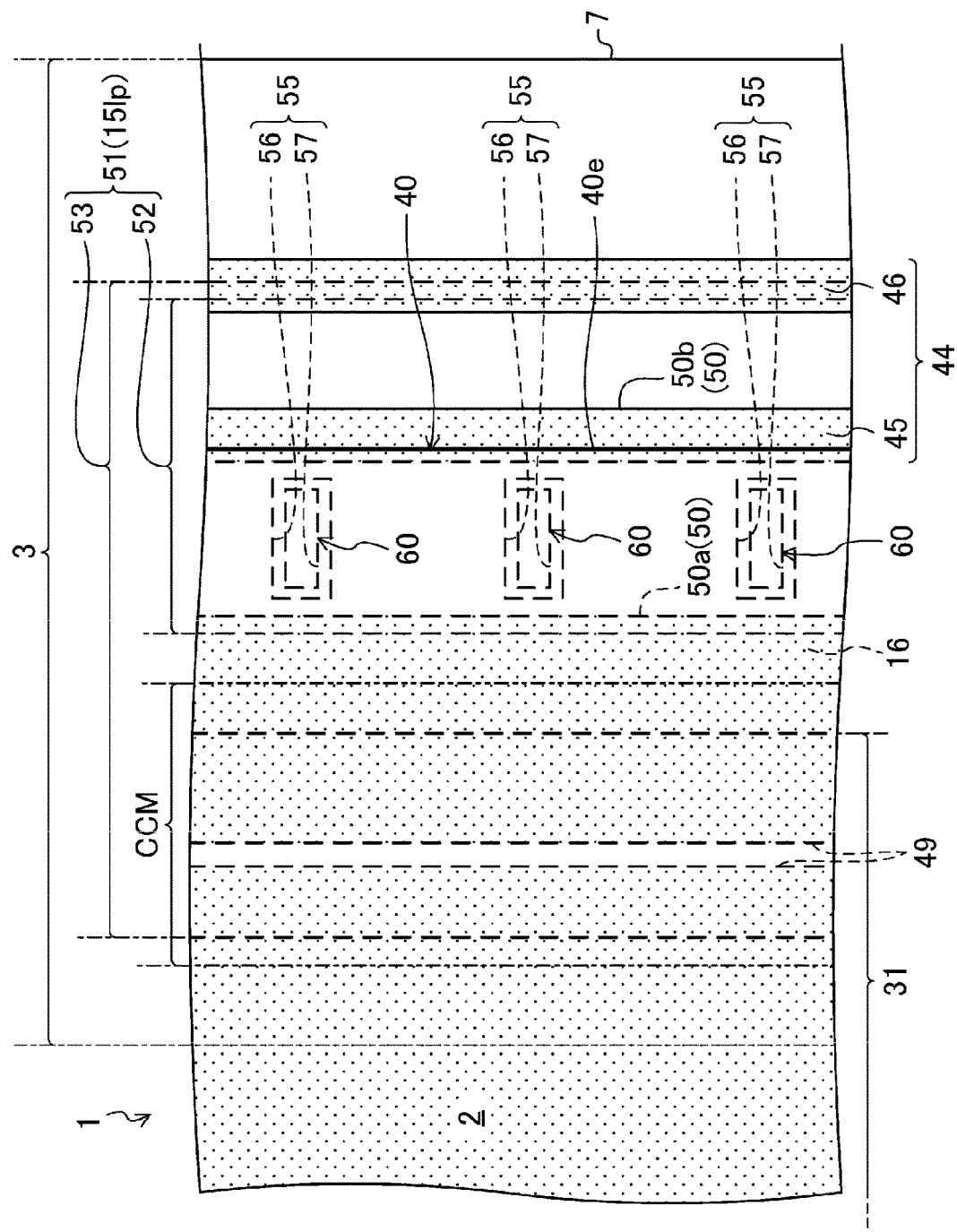
FIG. 10 is a view equivalent to FIG. 6 of an organic EL display device according to a second modification example of the embodiment.

FIG. 10 is a view equivalent to FIG. 6 of an organic EL display device 1 according to a second modification example of the embodiment. In the organic EL display device 1 according to the first modification example, the openings 55 each extend from the center site of the first slit 50a to the center site of the second slit 50b in the light reflective portion 51. However, as illustrated in FIG. 10, in the organic EL display device 1 according to the second modification example, openings 55 (a first opening 56 and a second opening 57) may be formed only in parts of a light reflective portion 51 on the display region 2 side with respect to a first dam wall 45.

According to this configuration, effects similar to the effects in the above-described embodiment can be obtained. Moreover, the opening area of the opening 55 in the light reflective portion 51 can be reduced as compared to the opening area in the first modification example. Thus, a decrease of electrical conductivity of the light reflective portion 51 due to provision of the openings 55, that is, a decrease of electrical conductivity of a low voltage power source wiring line 15lp can be suppressed.

Third Modification Example of Embodiment

Figure 11:
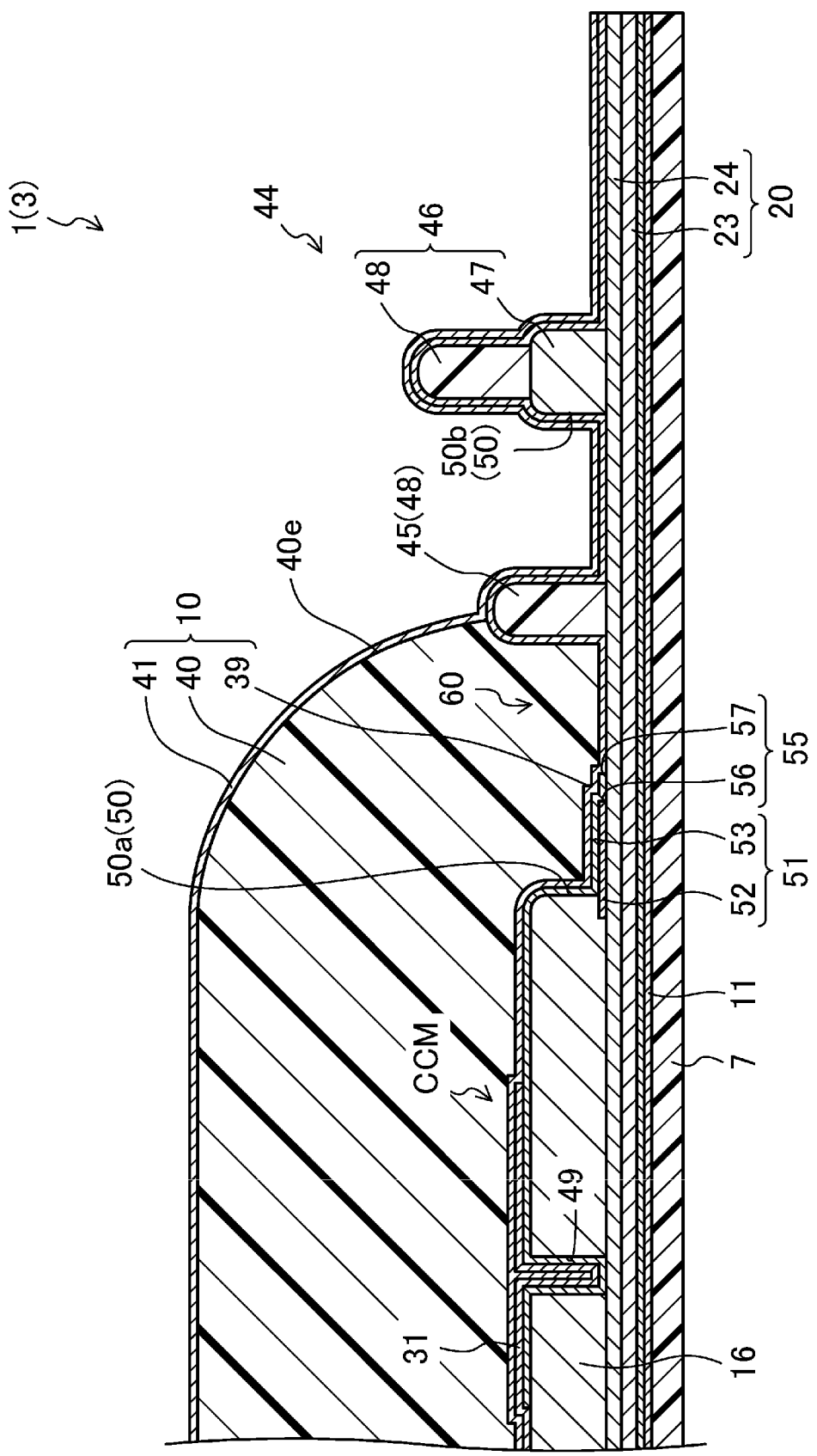
FIG. 11 is a view equivalent to FIG. 8 of an organic EL display device according to a third modification example of the embodiment.

FIG. 11 is a view equivalent to FIG. 8 of an organic EL display device 1 according to a third modification example of the embodiment. In the organic EL display device 1 according to the above-described embodiment, both the first dam wall 45 and the second dam wall 46 include a structure in which the first wall layer 47 and the second wall layer 48 are layered. However, as illustrated in FIG. 11, in the organic EL display device 1 according to the third modification example, a first dam wall 45 only includes a second wall layer 48. That is, the first dam wall 45 is formed of a material identical to a material of an edge cover 33 in a layer identical to a layer of the edge cover 33.

As with the above-described embodiment, a second dam wall 46 includes a structure in which a first wall layer 47 and the second wall layer 48 are layered. The aspects of a light reflective portion 51 (a first metal layer 52 and a second metal layer 53) and openings 55 (a first opening 56 and a second opening 57) are similar to those in the above-described embodiment. Then, a location at which the opening 55 is formed constitutes an inspected portion 60 for confirming a coating position of a material forming an organic layer 40. Similarly, according to this configuration, the same effects as the effects in the above-described embodiment can be obtained.

Fourth Modification Example of Embodiment

Figure 12:
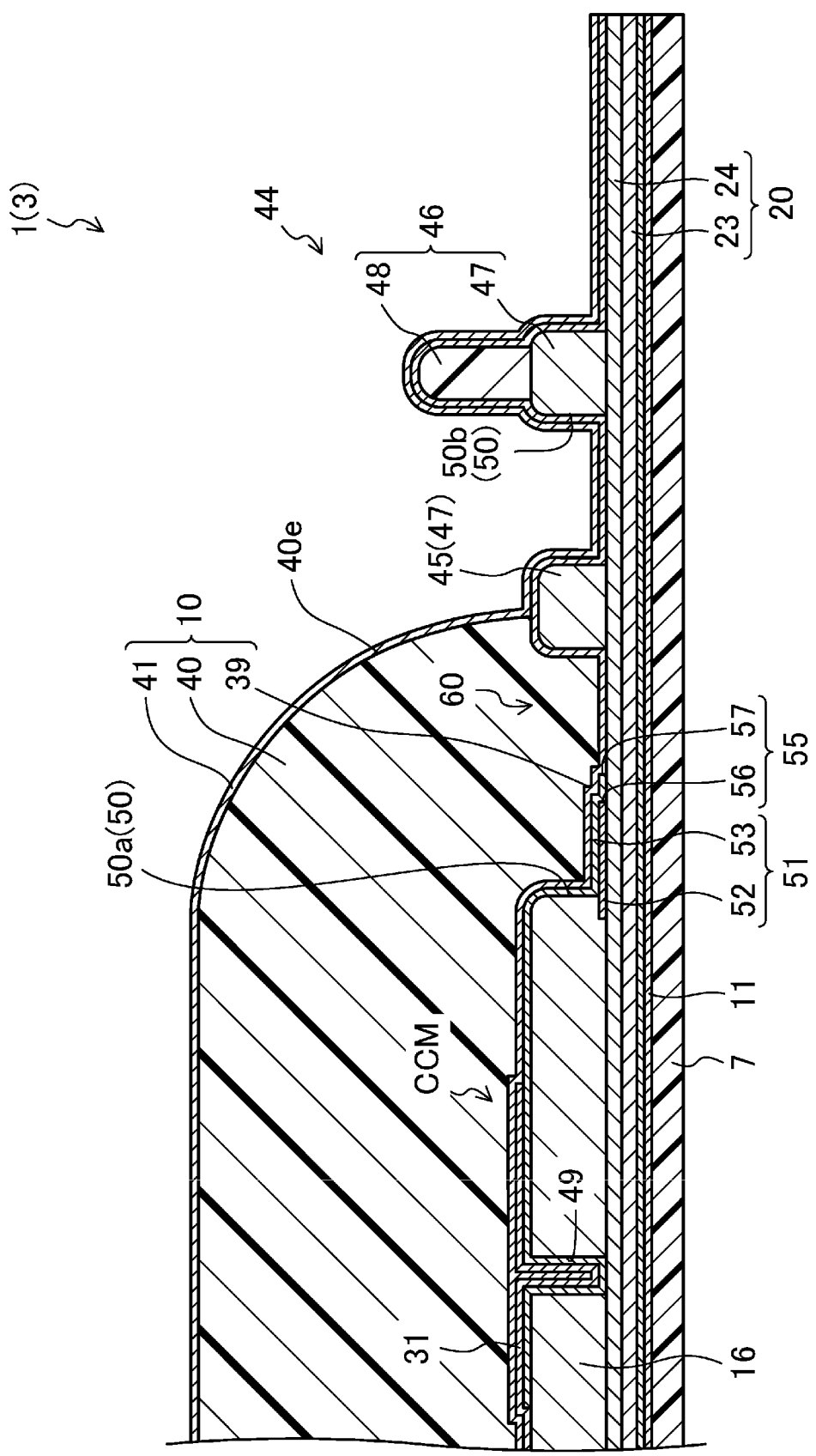
FIG. 12 is a view equivalent to FIG. 8 of an organic EL display device according to a fourth modification example of the embodiment.

FIG. 12 is a view equivalent to FIG. 8 of an organic EL display device 1 according to a fourth modification example of the embodiment. In the organic EL display device 1 according to the above-described embodiment, both the first dam wall 45 and the second dam wall 46 include a structure in which the first wall layer 47 and the second wall layer 48 are layered. However, as illustrated in FIG. 12, in the organic EL display device 1 according to the fourth modification example, a first dam wall 45 only includes a first wall layer 47. That is, the first dam wall 45 is formed of a material identical to a material of a flattening film 16 in a layer identical to a layer of the flattening film 16.

As with the above-described embodiment, a second dam wall 46 includes a structure in which the first wall layer 47 and a second wall layer 48 are layered. The aspects of a light reflective portion 51 (a first metal layer 52 and a second metal layer 53) and openings 55 (a first opening 56 and a second opening 57) are similar to those in the above-described embodiment. Then, a location at which the opening 55 is formed constitutes an inspected portion 60 for confirming a coating position of a material forming an organic layer 40. Similarly, according to this configuration, the same effects as the effects in the above-described embodiment can be obtained.

As described above, the preferred embodiments are described as an example of the technique disclosed herein. However, the technique disclosed herein is not limited to these embodiments, and is also applicable to an embodiment in which modification, replacement, adding, omission, and the like are suitably made. Additionally, the constituent elements described in the attached drawings and the detailed description may include constituent elements that are not essential for solving the problem. Thus, even when the unessential constituent elements are described in the attached drawings and the detailed description, such unessential constituent elements are not to be directly regarded as essential constituent elements.

In the embodiment described above, as an example, description is made on the aspect in which the first opening 56 is formed in the first metal layer 52, the second opening 57 of the second metal layer 53 is formed, and the opening 55 including the first opening 56 and the second opening 57 is formed in the light reflective portion 51. However, the technique of the present disclosure is not limited to this aspect. For example, the first metal layer 52 is provided only in a region in the outer side with respect to the first dam wall 45 in the frame region 3, and the second metal layer 53 is provided from the control circuit region CCM to the second dam wall 46 and overlaps the first metal layer 52 to be in contact with the first metal layer 52 in the outer side of the first dam wall 45. In this case, the opening 55 (the second opening 57) may be formed only in the second metal layer 53.

Additionally, for example, the second metal layer 53 is provided from the control circuit region CCM to a position in the inner side with respect to the middle of the first slit 50a, and the first metal layer 52 is provided from the inner side with respect to the first slit 50a to the second dam wall 46, and overlaps the second metal layer 53 to be coupled to the second metal layer 53 at a position in the inner side with respect to the middle of the first slit 42. In this case, the opening 55 (the first opening 56) may be formed only in a part of the first metal layer 52 that is positioned in the outer side with respect to the second metal layer 53 inside the first slit 50a.

In short, it is only required to form, in at least one metal layer of the first metal layer 52 and the second metal layer 53, the opening 55 exposing the lower layer of the first metal layer 52 from the at least one metal layer at the position at which the organic layer 40 and the slit 50 overlaps each other. That is, the technique of the present disclosure is not limited in any way as long as, in at least one metal layer of the first metal layer 52 and the second metal layer 53, an opening exposing the lower layer of the first metal layer 52 from the at least one metal layer is formed.

Additionally, in the embodiment described above, as an example, description is made on the aspect in which the opening 55 is a slit. However, the technique of the present disclosure is not limited to this aspect. The slit is merely an example of the opening 55. The opening 55 can employ any shape instead of a slit as long as the shape enables confirmation of a coating position of the material forming the organic layer 40.

Additionally, in the embodiment described above, the organic layer 40 is provided from the display region 2 to the first dam wall 45. However, the technique of the present disclosure is not limited to this embodiment. For example, the organic layer 40 may be provided from the display region 2 to the second dam wall 46, or may be provided to the outer side of the second dam wall 46.

Additionally, in the embodiment described above, the light reflective portion 51 constitutes the low voltage power source wiring line 15lp electrically coupled to the second electrode 31. However, the technique of the present disclosure is not limited to this embodiment. The light reflective portion 51 may not constitute the low voltage power source wiring line 15lp, and may be a metal layer constituting other wiring lines or electrodes of other function portions.

Additionally, in the embodiment described above, the organic EL layer 30 is individually formed for each of the subpixels 6. However, the applicable range of the technique of the present disclosure is not limited to this embodiment. The organic EL layer 30 may be provided and shared by the plurality of subpixels 6. In this case, the organic EL display device 1 may include a color filter to perform color tone expression of each of the subpixels 6.

Additionally, in the present embodiment, the organic EL display device 1 using the resin substrate layer 7 as a substrate is described as an example, but the applicable range of the technique of the present disclosure is not limited to this embodiment. As the substrate, a substrate including an inorganic material such as glass and quartz, plastic such as polyethylene terephthalate, and ceramic such as alumina may be used. Additionally, the substrate may be a substrate being a metal substrate such as aluminum and iron including one surface coated with silica gel, an organic insulating material, or the like, or a substrate being a metal substrate including a surface subjected to insulation treatment by a method such as anode oxidation.

Additionally, in the embodiment described above, the first TFT 12 and the second TFT 13 employ a top gate type structure. However, the applicable range of the technique of the present disclosure is not limited to this embodiment. The first TFT 12 and the second TFT 13 may employ a bottom gate type structure.

Additionally, in the embodiment described above, the organic EL layer 30 including a five-layered structure including the hole injection layer 34, the hole transport layer 35, the light-emitting layer 36, the electron transport layer 37, and the electron injection layer 38 is described as an example. However, the applicable range of the technique of the present disclosure is not limited to this embodiment. For example, the organic EL layer 30 may employ a three-layered structure including a hole injection-cum-transport layer, a light-emitting layer, and an electron transport-cum-injection layer.

Additionally, in the embodiment described above, the organic EL display device 1 in which the first electrode 29 is an anode electrode and the second electrode 31 is a cathode electrode is described as an example. However, the applicable range of the technique of the present disclosure is not limited to this embodiment. The technique of the present disclosure is applicable to, for example, the organic EL display device 1 including the organic EL layer 30 including a reversed layered structure in which the first electrode 29 is a cathode electrode and the second electrode 31 is an anode electrode.

Additionally, in the embodiment described above, the organic EL display device 1 is described as an example of the display device, but the technique of the present disclosure is not limited to this embodiment. The technique of the present disclosure is applicable to a display device including a plurality of current-driven light-emitting elements, for example, a display device including a quantum dot light-emitting diode (QLED) that is a light-emitting element using a quantum dot-containing layer.

INDUSTRIAL APPLICABILITY

As described above, the technique of the present disclosure is useful for a display device including a sealing structure in which a light-emitting element is covered with a sealing film including an organic layer.

The invention claimed is:

1. A display device comprising:
   a substrate;
   a first metal layer being provided on the substrate;
   a flattening film being provided on the first metal layer;
   a second metal layer and a plurality of light-emitting elements being provided on the flattening film; and
   a sealing film covering the plurality of light-emitting elements,
   wherein a display region and a frame region are provided, the display region in which an image is displayed by light emission of the plurality of light-emitting elements, and the frame region being positioned in a periphery of the display region,
   the sealing film includes an organic layer, and the organic layer includes a circumferential end edge being positioned in the frame region,
   a slit is formed in an outer side of the flattening film, the slit overlapping the circumferential end edge of the organic layer,
   the first metal layer and the second metal layer are each provided across the slit, and are in contact with each other inside the slit, and
   an opening is formed in at least one metal layer of the first metal layer and the second metal layer, the opening exposing a lower layer of the first metal layer from the at least one metal layer at a position at which the organic layer and the slit overlap each other,
   wherein a first opening is formed in the first metal layer as the opening, and
   a second opening is formed in the second metal layer as the opening, and
   wherein the first opening has opening area larger than opening area of the second opening, and the first metal layer is covered with the second metal layer.

2. A display device comprising:
   a substrate;
   a first metal layer being provided on the substrate;
   a flattening film being provided on the first metal layer;
   a second metal layer and a plurality of light-emitting elements being provided on the flattening film; and
   a sealing film covering the plurality of light-emitting elements,
   wherein a display region and a frame region are provided, the display region in which an image is displayed by light emission of the plurality of light-emitting elements, and the frame region being positioned in a periphery of the display region,
   the sealing film includes an organic layer, and the organic layer includes a circumferential end edge being positioned in the frame region,
   a slit is formed in an outer side of the flattening film, the slit overlapping the circumferential end edge of the organic layer,
   the first metal layer and the second metal layer are each provided across the slit, and are in contact with each other inside the slit, and
   an opening is formed in at least one metal layer of the first metal layer and the second metal layer, the opening exposing a lower layer of the first metal layer from the at least one metal layer at a position at which the organic layer and the slit overlap each other,
   wherein each of the plurality of light-emitting elements include a first electrode, a function layer being provided on the first electrode, and a second electrode being provided on the function layer,
   the second electrode is provided in and shared by the plurality of light-emitting elements, and
   the second metal layer is formed of a material identical to a material of the first electrode in a layer identical to a layer of the first electrode.

3. The display device according to claim 2,
   wherein a trench is formed in the flattening film, the trench passing through the flattening film, and
   the second metal layer and the second electrode cover an inner face of the trench, and are in contact with each other inside the trench.

4. The display device according to claim 3,
   wherein the first metal layer is formed of a material identical to a material of a source wiring line in a layer identical to a layer of the source wiring line, the source wiring line being provided in the display region,
   the second electrode is electrically coupled to the first metal layer via the second metal layer, and
   the first metal layer and the second metal layer constitute a frame wiring line, the frame wiring line being provided in the frame region and surrounding the display region.

5. The display device according to claim 2,
   wherein an edge cover is provided between the second metal layer and the second electrode in the display region,
   a first dam wall surrounding the display region and a second dam wall surrounding the first dam wall are provided in the frame region,
   the first dam wall is formed of a material identical to a material of the edge cover in a layer identical to a layer of the edge cover, and
   the second dam wall includes a first wall layer and a second wall layer, the first wall layer being formed of a material identical to a material of the flattening film in a layer identical to a layer of the flattening film, the second wall layer being formed of a material identical to a material of the edge cover in a layer identical to a layer of the edge cover.

6. The display device according to claim 5,
   wherein the opening is formed between the flattening film and the first dam wall.

7. The display device according to claim 5,
   wherein a plurality of the openings are formed at an interval along the first dam wall.

8. The display device according to claim 2,
   wherein an edge cover is provided between the second metal layer and the second electrode in the display region, a first dam wall surrounding the display region and a second dam wall surrounding the first dam wall are provided in the frame region, the first dam wall is formed of a material identical to a material of the flattening film in a layer identical to a layer of the flattening film, and the second dam wall includes a first wall layer and a second wall layer formed on the first wall layer, the first wall layer being formed of a material identical to a material of the flattening film in a layer identical to a layer of the flattening film, the second wall layer being formed of a material identical to a material of the edge cover in a layer identical to a layer of the edge cover.

9. The display device according to claim 5, wherein the opening is formed from a part of the at least one metal layer on a side of the display region with respect to the first dam wall to a part between the first dam wall and the second dam wall.

10. The display device according to claim 8, wherein the opening is formed between the flattening film and the first dam wall.

11. The display device according to claim 8, wherein the opening is formed from a part of the at least one metal layer on a side of the display region with respect to the first dam wall to a part between the first dam wall and the second dam wall.

12. The display device according to claim 8, wherein a plurality of the openings are formed at an interval along the first dam wall.

13. The display device according to claim 2, wherein an edge cover is provided between the second metal layer and the second electrode in the display region, a first dam wall surrounding the display region and a second dam wall surrounding the first dam wall are provided in the frame region, and each of the first dam wall and the second dam wall includes a first wall layer and a second wall layer formed on the first wall layer, the first wall layer being formed of a material identical to a material of the flattening film in a layer identical to a layer of the flattening film, the second wall layer being formed of a material identical to a material of the edge cover in a layer identical to a layer of the edge cover.

14. The display device according to claim 13, wherein the opening is formed between the flattening film and the first dam wall.

15. The display device according to claim 13, wherein the opening is formed from a part of the at least one metal layer on a side of the display region with respect to the first dam wall to a part between the first dam wall and the second dam wall.

16. The display device according to claim 13, wherein a plurality of the openings are formed at an interval along the first dam wall.

* * * * *